(12) United States Patent
Hsieh et al.

(10) Patent No.: US 6,582,995 B2
(45) Date of Patent: Jun. 24, 2003

(54) METHOD FOR FABRICATING A SHALLOW ION IMPLANTED MICROELECTRONIC STRUCTURE

(75) Inventors: Ting-Hua Hsieh, Hsin-chu (TW); Hung-Der Su, Sheh-Chung Village (TW); Carlos H. Diaz, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/903,125

(22) Filed: Jul. 11, 2001

(65) Prior Publication Data

US 2003/0013282 A1 Jan. 16, 2003

(51) Int. Cl.⁷ .................... H01L 21/335; H01L 21/336; H01L 21/425
(52) U.S. Cl. .................. 438/143; 438/229; 438/301; 438/306; 438/307; 438/514
(58) Field of Search .................. 438/514, 519, 438/207, 217, 231, 234, 143, 229, 232, 301, 306, 307, 527, 402, 476

(56) References Cited

U.S. PATENT DOCUMENTS

| | | | | |
|---|---|---|---|---|
| 4,745,083 A | * | 5/1988 | Huie | 257/316 |
| 4,992,388 A | * | 2/1991 | Pfiester | 148/DIG. 19 |
| 5,731,239 A | * | 3/1998 | Wong et al. | 438/296 |
| 5,888,874 A | * | 3/1999 | Manning | 438/309 |
| 5,908,309 A | * | 6/1999 | Andoh | 438/231 |
| 5,970,365 A | * | 10/1999 | Takamizawa et al. | 438/459 |
| 6,037,640 A | | 3/2000 | Lee | |
| 6,051,483 A | | 4/2000 | Lee et al. | |

* cited by examiner

Primary Examiner—Carl Whitehead, Jr.
Assistant Examiner—David L. Hogans
(74) Attorney, Agent, or Firm—Tung & Associates

(57) ABSTRACT

Within a method for fabricating a microelectronic fabrication comprising a topographic microelectronic structure formed over a substrate, there is implanted, while employing a first ion implant method and while masking a portion of the substrate adjacent the topographic microelectronic structure but not masking the topographic microelectronic structure, the topographic microelectronic structure to form an ion implanted topographic microelectronic structure without implanting the substrate. There is also implanted, while employing a second ion implant method, the portion of the substrate adjacent the topographic microelectronic substrate to form therein an ion implant structure. The method is particularly useful for fabricating source/drain regions with shallow junctions within field effect transistor (FET) devices.

11 Claims, 2 Drawing Sheets

METHOD FOR FABRICATING A SHALLOW ION IMPLANTED MICROELECTRONIC STRUCTURE

BACKGROUND OF THE INVENTION

1. Field of the Invention

The present invention relates generally to methods for fabricating ion implanted microelectronic structures, as employed for fabricating microelectronic fabrications. More particularly, the present invention relates to methods for fabricating shallow ion implanted microelectronic structures, as employed for fabricating microelectronic fabrications.

2. Description of the Related Art

Semiconductor integrated circuit microelectronic fabrications are formed from semiconductor substrates within and upon which are formed semiconductor devices, and over which are formed patterned conductor layers which are separated by dielectric layers.

Ubiquitous within the fabrication of semiconductor integrated circuit microelectronic fabrications is the use of field effect transistor (FET) devices as switching devices within both logic semiconductor integrated circuit microelectronic fabrications and memory semiconductor integrated circuit microelectronic fabrications. Field effect transistor (FET) devices are ubiquitous within the art of semiconductor integrated circuit microelectronic fabrication for use as switching devices within logic semiconductor integrated circuit microelectronic fabrications and memory semiconductor integrated circuit microelectronic fabrications insofar as field effect transistor (FET) devices, in addition to being generally readily fabricated within semiconductor integrated circuit microelectronic fabrications, are also generally readily scalable within semiconductor integrated circuit microelectronic fabrications.

While field effect transistor (FET) devices are thus clearly desirable in the art of semiconductor integrated circuit microelectronic fabrication and often essential in the art of semiconductor integrated circuit microelectronic fabrication, field effect transistor (FET) devices are nonetheless not entirely without problems in the art of semiconductor integrated circuit microelectronic fabrication. In that regard, while semiconductor integrated circuit microelectronic fabrication integration levels have increased and field effect transistor (FET) device dimensions have decreased, it is often difficult in the art of semiconductor integrated circuit microelectronic fabrication to fabricate semiconductor devices, and in particular field effect transistor (FET) devices, simultaneously with decreased dimensions and with enhanced performance.

It is thus desirable in the art of semiconductor integrated circuit microelectronic fabrication to provide methods and materials through which there may be fabricated within semiconductor integrated circuit microelectronic fabrications semiconductor devices, and in particular field effect transistor (FET) devices, simultaneously with decreased dimensions and enhanced performance.

It is towards the foregoing object that the present invention is directed.

Various semiconductor device structures having desirable properties, and methods for fabrication thereof, have been disclosed in the art of semiconductor integrated circuit microelectronic fabrication.

Included among the semiconductor device structures and methods for fabrication thereof, but not limiting among the semiconductor device structures and methods for fabrication thereof, are semiconductor device structures and methods for fabrication thereof disclosed within: (1) Lee, in U.S. Pat. No. 6,037,640 (a semiconductor device P-N junction structure formed within a semiconductor substrate, such as may be employed within a source/drain region within a field effect transistor (FET) device within a semiconductor integrated circuit microelectronic fabrication, formed of shallow depth and abrupt dopant transition by employing when fabricating the semiconductor device P-N junction structure within the semiconductor substrate: (1) a dose of a high energy co-implantation ion implanted deeper within the semiconductor substrate in conjunction with a dose of a low energy dopant ion implanted shallower within the semiconductor substrate; followed by (2) a rapid thermal annealing of the semiconductor substrate); and (2) Lee et al., in U.S. Pat. No. 6,051,483 (a semiconductor device P-N junction structure formed within a semiconductor substrate, such as may be employed within a source/drain region within a field effect transistor (FET) device within a semiconductor integrated circuit microelectronic fabrication, formed of shallow depth and abrupt dopant transition by employing when fabricating the semiconductor device P-N junction structure within the semiconductor substrate: (1) a low energy dopant ion implanted within the semiconductor substrate; in conjunction with (2) a microwave energy annealing of the semiconductor substrate).

Desirable in the art of semiconductor integrated circuit microelectronic fabrication are additional methods and materials which may be employed for fabricating within semiconductor integrated circuit microelectronic fabrications semiconductor devices, and in particular field effect transistor (FET) devices, with decreased dimensions and enhanced performance.

It is towards the foregoing object that the present invention is directed.

SUMMARY OF THE INVENTION

A first object of the present invention is to provide a method for fabricating within a semiconductor integrated circuit microelectronic fabrication a semiconductor device.

A second object of the present invention is to provide the method for fabricating within the semiconductor integrated circuit microelectronic fabrication the semiconductor device in accord with the first object of the present invention, wherein the semiconductor device is fabricated with decreased dimensions and enhanced performance.

A third object of the present invention is to provide the method for fabricating within the semiconductor integrated circuit microelectronic fabrication the semiconductor device in accord with the first object of the present invention and the second object of the present invention, wherein the method is readily commercially implemented.

In accord with the objects of the present invention, there is provided by a more specific embodiment of the present invention a method for fabricating a field effect transistor (FET) device.

To practice the more specific embodiment of the method of the present invention, there is first provided a semiconductor substrate having defined therein an active region. There is then formed upon the active region of the semiconductor substrate a gate dielectric layer. There is then formed upon the gate dielectric layer a patterned gate electrode material layer which defines a channel location within the active region of the semiconductor substrate which in turn separates a pair of source/drain locations within the active region of the semiconductor substrate. There is then implanted, while masking the pair of source/drain locations, a first dose of a first dopant into the patterned gate electrode material layer to form a gate electrode. There is also implanted, while not masking the pair of source/drain locations, a second dose of a second dopant into the pair of source/drain locations to form a pair of source/drain regions therein.

A more general embodiment of the present invention provides an analogous method for forming an ion implanted topographic microelectronic structure formed over a substrate employed within a microelectronic fabrication while independently forming an ion implanted structure within the substrate adjacent the ion implanted topographic microelectronic structure.

The present invention provides a method for fabricating within a semiconductor integrated circuit microelectronic fabrication a semiconductor device, and in particular a field effect transistor (FET) device, wherein the semiconductor device, and in particular the field effect transistor (FET) device, is fabricated with decreased dimensions and enhanced performance.

The present invention realizes the foregoing object when fabricating within the semiconductor integrated circuit microelectronic fabrication the field effect transistor (FET) device by: (1) implanting, while masking a pair of source/drain locations within an active region of a semiconductor substrate, a first dose of a first dopant into a patterned gate electrode material layer to form therefrom a gate electrode; and (2) implanting, while not masking the pair of source/drain locations within the active region of the semiconductor substrate, a second dose of a second dopant into the pair of source/drain locations to form a pair of source/drain regions. In particular, by masking the pair of source/drain locations within the active region of the semiconductor substrate when implanting the first dose of the first dopant into the patterned gate electrode material layer to form the gate electrode, the pair of source/drain regions when formed within the pair of source/drain locations may be formed independently and with more controlled ion implantation properties, such as in particular to provide the pair of source/drain regions with a controlled and shallow junction depth.

The method of the present invention is readily commercially implemented.

The present invention employs methods and materials as are generally known and/or readily available in the art of microelectronic fabrication, but employed within the context of specific process limitations to provide the present invention. Since it is thus at least in part a series of specific process limitations which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

Figure 1:
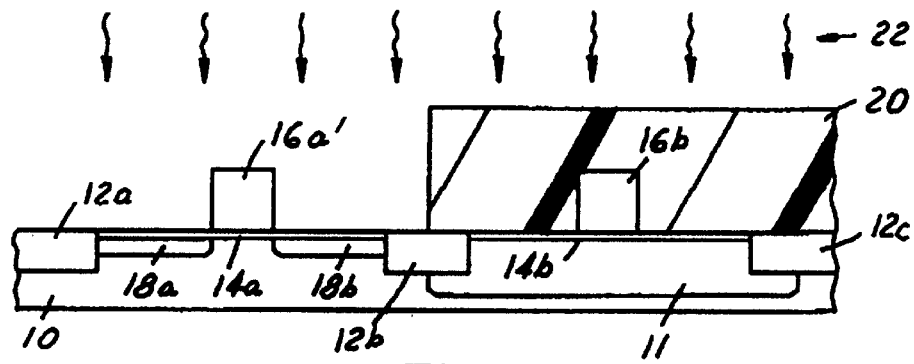
FIG. 1, FIG. 2, FIG. 3, FIG. 4, FIG. 5 and FIG. 6 show a series of schematic cross-sectional diagrams illustrating the results of progressive stages in forming, in accord with a preferred embodiment of the present invention, a field effect transistor (FET) device within a semiconductor integrated circuit microelectronic fabrication.

The present invention provides a method for fabricating within a semiconductor integrated circuit microelectronic fabrication a semiconductor device, and in particular a field effect transistor (FET) device, wherein the semiconductor device, and in particular the field effect transistor (FET) device, is fabricated with decreased dimensions and enhanced performance.

The present invention realizes the foregoing object when fabricating within the semiconductor integrated circuit microelectronic fabrication the field effect transistor (FET) device by: (1) implanting, while masking a pair of source/drain locations within an active region of a semiconductor substrate, a first dose of a first dopant into a patterned gate electrode material layer to form therefrom a gate electrode; and (2) implanting, while not masking the pair of source/drain locations within the active region of the semiconductor substrate, a second dose of a second dopant into the pair of source/drain locations to form a pair of source/drain regions. In particular, by masking the pair of source/drain locations within the active region of the semiconductor substrate when implanting the first dose of the first dopant into the patterned gate electrode material layer to form the gate electrode, the pair of source/drain regions when formed within the pair of source/drain locations may be formed independently and with more controlled ion implantation properties, such as in particular to provide the pair of source/drain regions with a controlled and shallow junction depth.

While, in accord with the foregoing, the present invention more preferably provides a method for forming within a semiconductor integrated circuit microelectronic fabrication, and with decreased dimensions and enhanced performance, a field effect transistor (FET) device, in a more general sense, the present invention also provides an analogous method for forming an ion implanted topographic microelectronic structure formed over a substrate employed within a microelectronic fabrication while independently forming an ion implanted structure within the substrate adjacent the ion implanted topographic microelectronic structure.

In accord with the more general embodiment of the present invention, there is first provided a substrate having formed thereover a topographic microelectronic structure. There is then implanted, while employing a first ion implant method and while masking a portion of the substrate adjacent the topographic microelectronic structure but not masking the topographic microelectronic structure, the topographic microelectronic structure to form an ion implanted topographic microelectronic structure without implanting the substrate. Finally, there is also implanted, while employing a second ion implant method, the portion of the substrate adjacent the topographic microelectronic substrate to form therein an ion implant structure.

Within the more general embodiment of the present invention, the substrate may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. Similarly, within the more general embodiment of the present invention, the topographic feature may be formed of a microelectronic material selected from the group including but not limited to microelectronic conductor materials, microelectronic semiconductor materials and microelectronic dielectric materials. Finally, ion implantation parameters and limits employed within the more general embodiment of the present invention follow analogously with ion implantation parameters and limits employed within the more specific embodiment of the present invention.

Referring now to FIG. 1 to FIG. 6, there is shown a series of schematic cross-sectional diagrams illustrating the results of progressive stages in forming, in accord with a preferred embodiment of the present invention, a field effect transistor (FET) device within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a series of isolation regions 12a, 12b and 12c which defines a pair of active regions of the semiconductor substrate 10. As is also shown within the schematic cross-sectional diagram of FIG. 1, the active region of the semiconductor substrate defined by the pair of isolation regions 12b and 12c is formed from a well 11 formed within the semiconductor substrate 10.

Within the preferred embodiment of the present invention with respect to the semiconductor substrate 10, and although semiconductor substrates are known in the art of semiconductor integrated circuit microelectronic fabrication with various semiconductor materials compositions (such as but not limited to silicon, germanium, silicon-germanium alloy, gallium-arsenide alloy and other higher order alloy semiconductor materials compositions), various crystallographic orientations and various doping levels, for the preferred embodiment of the present invention, the semiconductor substrate 10 is typically and preferably, but not exclusively, a (100) silicon semiconductor substrate, wherein the well 11 and the remaining portion of the semiconductor substrate 10 have complementary N-dopant concentrations and P-dopant concentrations.

Similarly, and although it is also known in the art of semiconductor integrated circuit microelectronic fabrication that isolation regions may be formed employing methods including but not limited to isolation region thermal growth methods and isolation region deposition/patterning methods, for the preferred embodiment of the present invention, the series of isolation regions 12a, 12b and 12c is, as is illustrated within the schematic cross-sectional diagram of FIG. 1, preferably, but not exclusively, formed as a series of shallow trench isolation (STI) regions formed at least in part employing an isolation region deposition/patterning method.

Shown also within the schematic cross-sectional diagram of FIG. 1, and formed upon each of the pair of active regions of the semiconductor substrate 10 is a pair of gate dielectric layers 14a and 14b.

Within the preferred embodiment of the present invention with respect to the pair of gate dielectric layers 14a and 14b, and although it is known in the art of semiconductor integrated circuit microelectronic fabrication that gate dielectric layers may be formed employing methods including but not limited to gate dielectric layer thermal growth methods and gate dielectric layer deposition/patterning methods, for the preferred embodiment of the present invention, the pair of gate dielectric layers 14a and 14b is typically and preferably formed at least in part of a silicon oxide gate dielectric material formed upon a corresponding active region of the semiconductor substrate 10 to a thickness of from about 10 Å to about 200 Å, while employing a gate dielectric layer thermal growth method.

There is also shown within the semiconductor integrated circuit microelectronic fabrication whose schematic cross-sectional diagram is illustrated in FIG. 1, and formed upon the gate dielectric layer 14a, a lightly doped gate electrode material layer 16a' formed from a patterned gate electrode material layer which is lightly doped with a dose of first implanting dopant ions 22 while being employed as a mask for forming a pair of lightly doped drain (LDD) extension regions 18a and 18b within the active region of the semiconductor substrate 10 defined by the pair of isolation regions 12a and 12b. Similarly, there is also shown within the semiconductor integrated circuit whose schematic cross-sectional diagram is illustrated in FIG. 1 a patterned photoresist layer 20 which masks an additional patterned gate electrode material layer 16b from the dose of first implanting dopant ions 22 such that there is not formed within the active region of the semiconductor substrate 10 defined by the pair of isolation regions 12b and 12c, and beneath the gate dielectric layer 14b, an additional pair of lightly doped drain (LDD) extension regions.

Within the preferred embodiment of the present invention with respect to the gate electrode material from which is formed: (1) the lightly doped patterned gate electrode material layer 16a'; and (2) the patterned gate electrode material layer 16b, and although gate electrodes may in general ultimately be formed within field effect transistor (FET) devices within semiconductor integrated circuit microelectronic fabrications from gate electrode materials including but not limited to metal, metal alloy, doped polysilicon (having a dopant concentration of greater than about 1E17 dopant atoms per cubic centimeter) and polycide (doped polysilicon/metal silicide stack) gate electrode materials, for the preferred embodiment of the present invention, the gate electrode material from which is formed both the lightly doped patterned gate electrode material layer 16a' and the patterned gate electrode material layer 16b is formed at least in part of a polysilicon material, typically and preferably undoped, formed to a thickness of from about 700 to about 3000 angstroms upon each of the active regions of the semiconductor substrate as illustrated within the schematic cross-sectional diagram of FIG. 1.

Within the preferred embodiment of the present invention with respect to the patterned photoresist layer 20, the patterned photoresist layer 20 may be formed of photoresist materials as are conventional in the art of microelectronic fabrication, including but not limited to photoresist materials selected from the general groups of photoresist materials including but not limited to positive photoresist materials and negative photoresist materials. Typically and preferably, the patterned photoresist layer 20 is formed to a thickness of from about 3000 to about 12000 angstroms, while completely covering the active region of the semiconductor substrate 10 defined by the pair of isolation regions 12b and 12c while not covering the active region of the semiconductor substrate 10 defined by the pair of isolation regions 12a and 12b.

Finally, within the preferred embodiment of the present invention with respect to the dose of first implanting dopant ions 22, the dose of first implanting dopant ions 22 is typically and preferably provided at a comparatively low dose and a comparatively low energy, such as to provide the pair of lightly doped drain (LDD) extension regions 18a and 18b within the active region of the semiconductor substrate 10 defined by the pair of isolation regions 12a and 12b.

Typically and preferably, the dose of first implanting dopant ions 22 is provided at an ion implant dose of from about 1E13 to about 1E16 dopant ions per square centimeter and an ion implantation energy of from about 0.1 to about 200 kev to provide within the active region of the semiconductor substrate defined by the pair of isolation regions 12a and 12b the pair of lightly doped drain (LDD) extension regions 18a and 18b while simultaneously forming from a patterned gate electrode material layer the lightly doped patterned gate electrode material layer 16a'.

As is understood by a person skilled in the art, the semiconductor integrated circuit microelectronic fabrication whose schematic cross-sectional diagram is illustrated in FIG. 1 is representative of a complementary metal oxide semiconductor (CMOS) semiconductor integrated circuit microelectronic fabrication, wherein each of: (1) a first transistor (FET) device formed within and upon the active region of the semiconductor substrate 10 defined by the pair of isolation regions 12a and 12b; and (2) a second field effect transistor (FET) device formed within and upon the active region of the semiconductor substrate 10 defined by the pair of isolation regions 12b and 12c, is formed employing nominally equivalent dimensions and process methodology, but with different polarities as effected by employing different polarities when implanting several doses of implanting dopant ions within various locations to form each of the foregoing two field effect transistor (FET) devices. Similarly, within the present invention and the preferred embodiment of the present invention for each of the foregoing two field effect transistor (FET) devices within the complementary metal oxide semiconductor (CMOS) semiconductor integrated circuit microelectronic fabrication, it is desired to employ a single dopant polarity for a pair of source/drain regions and a gate electrode, while simultaneously providing the pair of source/drain regions with comparatively shallow junctions, such as in turn to enhance performance of each of the pair of field effect transistor (FET) devices. As is finally understood by a person skilled in the art, within both of the field effect transistor (FET) devices formed through further processing of the semiconductor integrated circuit microelectronic fabrication whose schematic cross-sectional diagram is illustrated in FIG. 1, the portions of the active regions of the semiconductor substrate 10 not covered by the corresponding lightly doped patterned gate electrode material layer 16a' or the patterned gate electrode material layer 16b are recognized as source/drain locations within which are subsequently formed source/drain regions.

For purposes of further clarity with respect to disclosure of the present invention and the preferred embodiment of the present invention, further processing of the semiconductor integrated circuit microelectronic fabrication whose schematic cross-sectional diagram is illustrated in FIG. 1 will be described only within the context of further processing of the field effect transistor (FET) device within the active region of the semiconductor substrate as defined by the pair of isolation regions 12a and 12b. As is understood by a person skilled in the art, additional pairs of complementary photoresist masking process steps, such as is illustrated in part within the schematic cross-sectional diagram of FIG. 1, are undertaken for an additional complementary series of ion implant process steps undertaken incident to further processing of the semiconductor integrated circuit microelectronic fabrication whose schematic cross-sectional diagram is illustrated in FIG. 1.

Figure 2:
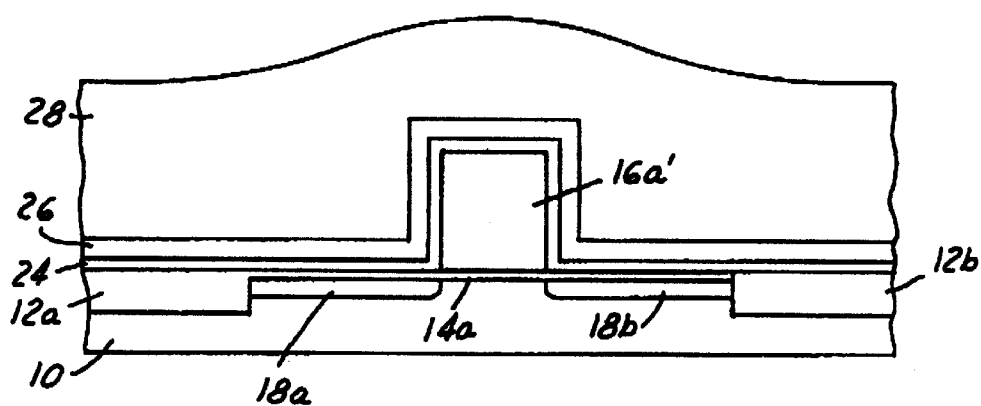

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein there is formed upon or over exposed portions of: (1) the pair of isolation regions 12a and 12b, the gate dielectric layer 14a and the lightly doped gate electrode material layer 16a' a series of three blanket layers comprising: (1) a blanket conformal liner layer 24 formed upon exposed portions of the pair of isolation regions 12a and 12b, the gate dielectric layer 14a and the lightly doped patterned gate electrode material layer 16a'; (2) a blanket conformal planarizing stop layer 26 formed upon the blanket conformal liner layer 24; and (3) a blanket masking layer 28 formed upon blanket conformal planarizing stop layer 26.

Within the present invention and the preferred embodiment of the present invention, each of the foregoing three blanket layers may be formed employing methods and materials as are conventional or unconventional in the art of semiconductor integrated circuit microelectronic fabrication provided that: (1) the blanket conformal planarizing stop layer 26 serves as a planarizing stop layer incident to planarizing the blanket mask layer 28; and (2) the blanket conformal liner layer 24 serves as a liner layer and an etch stop layer with respect to the blanket conformal planarizing stop layer 26.

Thus, within the context of the foregoing restrictions and requirements, each of the blanket conformal liner layer 24, the blanket conformal planarizing stop layer 26 and the blanket masking layer 28 may independently be formed of a microelectronic material selected from the group including but not limited to microelectronic conductor materials, microelectronic semiconductor materials and microelectronic dielectric materials.

However, for purposes of a more specific illustration of the present invention, which is by no means limiting with respect to materials selections for the foregoing three layers within the present invention: (1) the blanket conformal liner layer 24 is typically and preferably formed of a silicon oxide dielectric material formed conformally upon exposed portions of the pair of isolation regions 12a and 12b, the gate dielectric layer 14a and the lightly doped patterned gate electrode material layer 16a' to a thickness of from about 100 to about 500 angstroms; (2) the blanket conformal planarizing stop layer 26 is typically and preferably formed of a silicon nitride planarizing stop material formed upon the blanket conformal liner layer 24 to a thickness of from about 300 to about 1000 angstroms; and (3) the blanket mask layer 28 is typically and preferably formed of a silicon mask material, such as an amorphous silicon mask material or a polysilicon mask material, formed upon the blanket conformal planarizing stop layer 26 to a thickness of from about 1000 to about 6000 angstroms.

Within the present invention and the preferred embodiment of the present invention, it is particularly desirable to employ for forming the blanket mask layer 28 a silicon material, insofar as a silicon material generally serves as an efficient getter material for masking and gettering implanted dopant ions, as will be illustrated in greater detail within the context of further fabrication of the semiconductor integrated circuit microelectronic fabrication whose schematic cross-sectional diagram is illustrated in FIG. 2.

Figure 3:
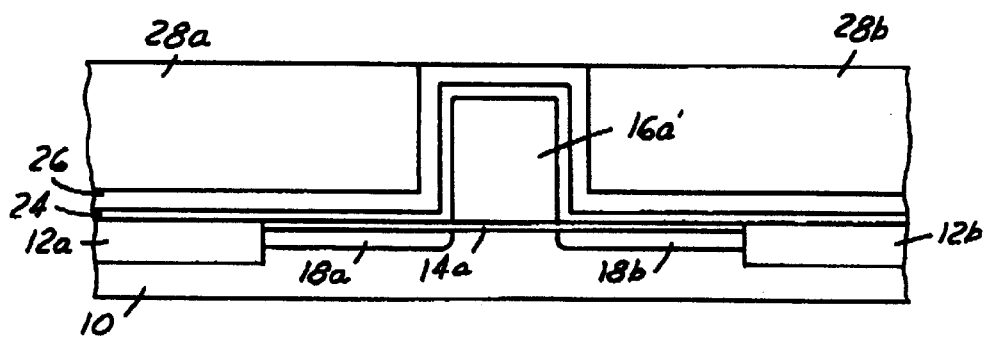

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein the blanket mask layer 28 has been planarized to form a pair of patterned planarized mask layers 28a and 28b, while employing as a planarizing stop layer a portion of the blanket conformal planarizing stop layer 26, to thus uncover with respect to the blanket planarizing layer 28 the lightly doped gate electrode material layer 16a'.

Within the present invention and the preferred embodiment of the present invention, the blanket mask layer 28 may be planarized to form the pair of patterned planarized mask layers 28a and 28b, while employing the portion of the blanket conformal planarizing stop layer 26 as a planarizing stop layer, while employing planarizing methods as are conventional in the art of microelectronic fabrication, such planarizing methods including in particular chemical mechanical polish (CMP) planarizing methods. Typically and preferably, such chemical mechanical polish (CMP) planarizing methods will employ slurry compositions comprising silica or $CsO_2$ when the blanket mask layer 28 is formed of a silicon material and in particular a polysilicon material.

Figure 4:
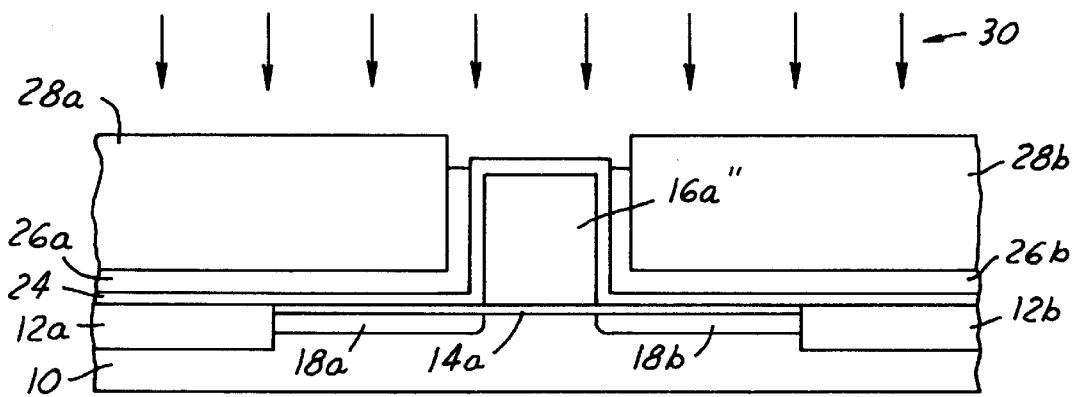

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein, in a first instance, the exposed portion of the blanket conformal planarizing stop layer 26 as illustrated within the schematic cross-sectional diagram of FIG. 3 has been etched, while employing the blanket conformal liner 24 layer as an etch stop layer, to form a pair of patterned conformal planarizing stop layers 26a and 26b.

Within the present invention and the preferred embodiment of the present invention, the exposed portion of the blanket conformal planarizing stop layer 26 may be etched while employing the blanket conformal liner layer 24 as an etch stop layer to form the pair of patterned conformal planarizing stop layers 26a and 26b while employing etchants as are conventional or unconventional in the art of semiconductor integrated circuit microelectronic fabrication, such etchants including but not limited to wet chemical etchants and dry plasma etchants. In particular, within the present invention and the preferred embodiment of the present invention when the blanket conformal planarizing stop layer 26 is formed of a silicon nitride material, there is typically and preferably employed an aqueous phosphoric acid wet chemical etchant at elevated temperature for forming from the blanket conformal planarizing stop layer 26 the pair of patterned conformal planarizing stop layers 26a and 26b.

Shown also within the schematic cross-sectional diagram of FIG. 4 is a dose of second implanting dopant ions 30 which is employed for implanting the lightly doped patterned gate electrode material layer 16a' to form therefrom a fully implanted gate electrode 16a" while not implanting the source/drain locations of the active region of the semiconductor substrate 10 within which is formed the pair of lightly doped drain (LDD) extension regions 18a and 18b.

Within the present invention and the preferred embodiment of the present invention, the dose of second implanting dopant ions 30 is typically and preferably provided of a polarity equivalent to the polarity of the lightly doped patterned gate electrode material layer 16a', while employing a comparatively high dopant concentration of from about 1E13 to about 1E16 dopant ions per square centimeter and a comparatively high ion implantation energy of from about 0.1 to about 200 kev.

Figure 5:
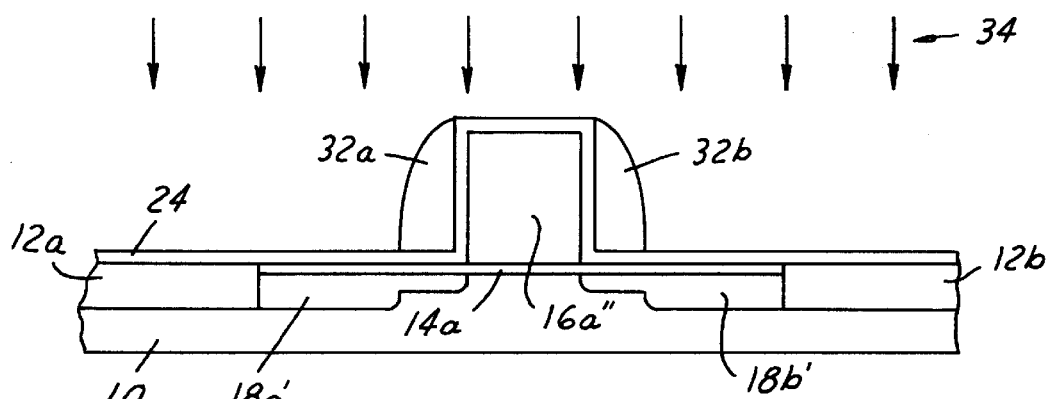

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein, in a first instance, both the pair of patterned planarized mask layers 28a and 28b and the pair of patterned conformal planarizing stop layers 26a and 26b have been stripped from the semiconductor integrated circuit microelectronic fabrication.

Within the present invention and the preferred embodiment of the present invention, both the pair of patterned mask layers 28a and 28b and the pair of patterned conformal planarizing stop layers 26a and 26b may be stripped from the semiconductor integrated circuit microelectronic fabrication whose schematic cross-sectional diagram is illustrated in FIG. 4 to provide in part the semiconductor integrated circuit microelectronic fabrication whose schematic cross-sectional diagram is illustrated in FIG. 5 while employing stripping methods and materials as are conventional or unconventional in the art of semiconductor integrated circuit microelectronic fabrication. Such stripping methods will typically and preferably include: (1)KOH or dry etch for stripping the pair of patterned planarized mask layers 28a and 28b when formed of a silicon material; and (2) an aqueous phosphoric acid etchant material at elevated temperature for stripping the pair of patterned conformal planarizing stop layers 26a and 26b when formed of the silicon nitride material.

Shown also within the schematic cross-sectional diagram of FIG. 5 is a pair of spacer layers 32a and 32b formed upon the remaining blanket conformal liner layer 24 and adjacent to the gate electrode 16a".

Within the present invention and the preferred embodiment of the present invention, the pair of spacer layers 32a and 32b may be formed employing methods and materials as are conventional in the art of semiconductor integrated circuit microelectronic fabrication, to provide the pair of spacer layers 32a and 32b formed of a microelectronic material selected from the group including but not limited to microelectronic conductor materials, microelectronic semiconductor materials and microelectronic dielectric materials. More typically and preferably, the pair of spacer layers 32a and 32b is formed of a microelectronic dielectric material formed employing an anisotropic plasma etching of a blanket dielectric layer, typically and preferably formed of a silicon nitride material, as is otherwise generally conventional in the art of semiconductor integrated circuit microelectronic fabrication.

Finally, there is also shown within the schematic cross-sectional diagram of FIG. 5 a dose of third implanting dopant ions 34 which is employed for forming into the active region of the semiconductor substrate 10, while employing the blanket conformal liner layer 24, the pair of spacer layers 32a and 32b and the gate electrode 16a" as a mask (but without specifically masking the gate electrode 16a"), a pair of source/drain regions 18a' and 18b' having incorporated therein the pair of lightly doped drain (LDD) extension regions 18a and 18b as illustrated within the schematic cross-sectional diagram of FIG. 4.

Within the present invention and the preferred embodiment of the present invention, the dose of third implanting dopant ions 34 is typically and preferably provided at a generally high ion implantation dose of from about 1E13 to about 1E16 dopant ions per square centimeter and a generally low ion implantation energy of from about 0.1 to about 200 kev, to provide the pair of source/drain regions 18a' and 18b' having incorporated therein the pair of lightly doped drain (LDD) extension regions 18a and 18b of a generally shallow junction depth of from about 700 to about 2000 angstroms.

Figure 6:
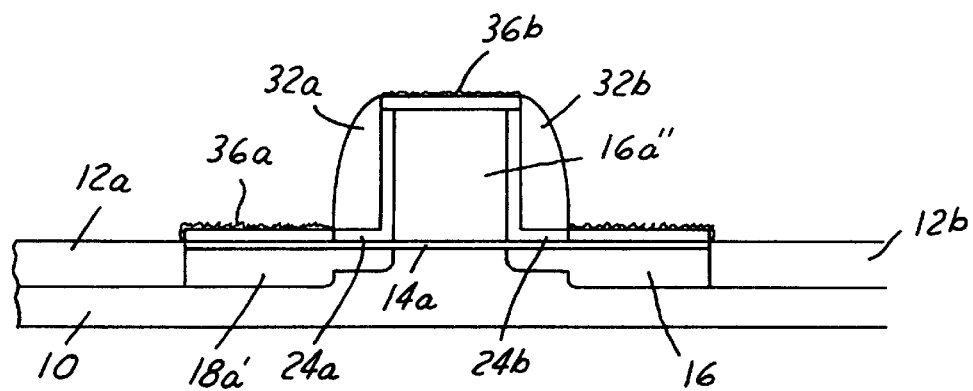

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein, in a first instance, exposed portions of the blanket conformal liner layer 24 have been stripped from the semiconductor integrated circuit microelectronic fabrication.

Within the present invention and the preferred embodiment of the present invention, exposed portions of the blanket conformal liner layer 24 as illustrated within the schematic cross-sectional diagram of FIG. 5 may be stripped therefrom to provide the pair of patterned conformal liner layers 24a and 24b as illustrated within the schematic cross-sectional diagram of FIG. 6 while employing stripping methods and materials as are conventional in the art of semiconductor integrated circuit microelectronic fabrication. Such stripping methods and materials may include, but are not limited to dry plasma stripping methods which may employ fluorine containing etchant gas compositions, as well as wet chemical stripping methods which may employ fluoride containing etchant liquid compositions.

Shown also within the schematic cross-sectional diagram of FIG. 6 is a series of metal silicide layers 36a, 36b and 36c formed respectively upon exposed surfaces of the source/drain region 18a', the gate electrode 16a" and the source/drain region 18b'.

Within the present invention and the preferred embodiment of the present invention, the series of silicide layers 36a, 36b and 36c may be formed employing methods as are conventional in the art of semiconductor integrated circuit microelectronic fabrication, including but not limited to selective formation methods and non-selective formation methods, but in particular selective silicide formation methods. The series of silicide layers 36a, 36b and 36c is typically and preferably formed to a thickness of from about 300 to about 800 each from any of several silicide materials as are conventional in the art of microelectronic fabrication.

As is understood by a person skilled in the art, although the preferred embodiment of the present invention as illustrated within the schematic cross-sectional diagrams of FIG. 1 to FIG. 6 illustrate the present invention within the context of: (1) first implanting a lightly doped patterned gate electrode material layer to form a gate electrode while masking a pair of source/drain locations; and (2) subsequently implanting within the pair of source/drain locations a pair of source/drain regions, a reverse ordering of forming the pair of source/drain regions and the gate electrode is also within the context of the present invention and the preferred embodiment of the present invention.

Similarly, and although not specifically illustrated within the schematic cross-sectional diagrams of FIG. 1 to FIG. 6, there is often employed when forming the silicide layers 36a, 36b and 36c, as well as various of the ion implanted structures, thermal annealing methods at a temperature of from about 500 to about 950 degrees centigrade.

Upon forming the semiconductor integrated circuit microelectronic fabrication whose schematic cross-sectional diagram is illustrated in FIG. 6, there is formed a semiconductor integrated circuit microelectronic fabrication having formed therein a field effect transistor (FET) device with enhanced performance. The field effect transistor (FET) device exhibits the enhanced performance incident to masking a pair of source/drain locations within the field effect transistor while implanting a patterned gate electrode material layer to form a gate electrode within the field effect transistor (FET) device, such that when implanting within the pair of source/drain locations a pair of source/drain regions there may be employed a comparatively low implantation energy which provides for a comparatively shallow junction for the pair of source/drain regions which results in enhanced performance of the field effect transistor (FET) device.

As is understood by a person skilled in the art, the preferred embodiment of the present invention is illustrative of the present invention rather than limiting of the present invention. Revisions and modifications may be made to methods, materials, structures and dimensions through which is provided a field effect transistor (FET) device in accord with the preferred embodiment of the present invention while still providing a method for fabricating a microelectronic fabrication in accord with the present invention, further in accord with the accompanying claims.

What is claimed is:

1. A method for fabricating a microelectronic fabrication comprising:

providing a substrate;

forming over the substrate a topographic microelectronic structure;

implanting, while employing a first ion implant method and while masking a portion of the substrate adjacent the topographic microelectronic structure but not masking the topographic microelectronic structure, the topographic microelectronic structure to form an ion implanted topographic microelectronic structure without implanting the substrate, the masking being undertaken employing a patterned masking layer Conned from a blanket masking layer which is planarized to uncover the topographic microelectronic structure, the blanket masking layer being formed from a silicon material selected from the group consisting of amorphous silicon materials and polycrystalline silicon materials; and implanting, while employing a second ion implant method, the portion of the substrate adjacent the topographic microelectronic structure to form therein an ion implant structure.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the topographic microelectronic structure is formed from a microelectronic material selected from the group consisting of microelectronic conductor materials, microelectronic semiconductor materials and microelectronic dielectric materials.

4. The method of claim 1 wherein the first ion implant method employs an ion implantation energy of from about 0.1 to about 200 kev and the second ion implant method employs an ion implantation energy of from about 0.1 to about 200 kev.

5. The method of claim 1 wherein the first ion implant method is performed prior to the second ion implant method.

6. The method of claim 1 wherein the second ion implant method is performed prior to the first ion implant method.

7. A method for fabricating a field effect transistor (FET) device comprising:

providing a semiconductor substrate having defined therein an active region;

forming upon the active region of the semiconductor substrate a gate dielectric layer;

forming upon the gate dielectric layer a patterned gate electrode material layer which defines a channel location within the active region of the semiconductor substrate which in turn separates a pair of source/drain locations within the active region of the semiconductor substrate;

implanting, while masking the pair of source/drain locations, a first dose of a first dopant into the patterned gate electrode material layer to form a gate electrode, the masking being undertaken employing a patterned masking layer formed from a blanket masking layer which is planarized to uncover the patterned gate electrode material layer, the blanket masking layer being formed from a silicon material selected from the group consisting of amorphous silicon materials and polycrystalline silicon materials; and implanting, while not masking the pair of source/drain locations, a second dose of a second dopant into the pair of source/drain locations to form a pair of source/drain regions.

8. The method of claim 7 wherein the patterned gate electrode material layer is formed at least in part of a polysilicon material.

9. The method of claim 7 wherein the first ion implant method employs an ion implantation energy of from about 0.1 to about 200 kev and the second ion implant method employs an ion implantation energy of from about 0.1 to about 200 kev.

10. The method of claim 7 wherein the first ion implant method is performed prior to the second ion implant method.

11. The method of claim 7 wherein the second ion implant method is performed prior to the first ion implant method.

* * * * *